United States Patent
Tadaka et al.

(10) Patent No.: US 8,519,334 B2
(45) Date of Patent: Aug. 27, 2013

(54) SCANNING ELECTRON MICROSCOPE AND SAMPLE OBSERVATION METHOD

(75) Inventors: Satoshi Tadaka, Hitachinaka (JP); Naomasa Suzuki, Hitachinaka (JP); Naoma Ban, Hitachinaka (JP); Tatsuichi Kato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/639,999

(22) PCT Filed: Apr. 20, 2011

(86) PCT No.: PCT/JP2011/002300
§ 371 (c)(1),
(2), (4) Date: Oct. 8, 2012

(87) PCT Pub. No.: WO2011/138853
PCT Pub. Date: Nov. 10, 2011

(65) Prior Publication Data
US 2013/0037716 A1 Feb. 14, 2013

(30) Foreign Application Priority Data

May 6, 2010 (JP) ................................ 2010-106084
Jan. 11, 2011 (JP) ................................ 2011-002650

(51) Int. Cl.
*H01J 37/28* (2006.01)
*H01J 37/256* (2006.01)
*G01N 23/00* (2006.01)

(52) U.S. Cl.
USPC ........ 250/310; 250/306; 250/307; 250/492.2; 250/492.3

(58) Field of Classification Search
USPC .............. 250/310, 306, 307, 492.2, 492.3
See application file for complete search history.

(56) References Cited

U.S. PATENT DOCUMENTS 6,635,873 B1    10/2003   Todokoro et al.
7,241,993 B2 *   7/2007   Nakasuji et al. ............... 250/310
(Continued)

FOREIGN PATENT DOCUMENTS

JP    2000-200579 A    7/2000
JP    2009-037804 A    2/2009
(Continued)

OTHER PUBLICATIONS

H. Tanaka et al., "Bit Cost Scalable Technology with Punch and Plug Process for Ultra High Density Flash Memory," 2007 Symposium on VLSI Technology Digest of Technical Papers, pp. 14-15.

*Primary Examiner* — Nikita Wells
(74) *Attorney, Agent, or Firm* — McDermott Will & Emery LLP

(57) ABSTRACT

The present invention provides a contact hole observation technology for avoiding a situation in which it is difficult to observe a contact hole as a nonuniform charge is formed in the contact hole due to a tilted electron beam during a process for forming a preliminary charge on a sample. The present invention also provides a scanning electron microscope based on such a contact hole observation technology. During a preliminary charge process, an electron beam is allowed to become incident in a plurality of directions to perform a precharge, thereby reducing a region within the contact hole that is not irradiated with the electron beam. This reduces the number of secondary electrons that become lost on the wall surface of the contact hole, thereby making it possible to acquire information about the bottom of the contact hole. Further, the precharge is processed by dividing a precharge irradiation region into a plurality of ring-shaped regions concentric with an observation region and precharging each of the ring-shaped regions in a plurality of scanning directions.

11 Claims, 11 Drawing Sheets

(56) References Cited

U.S. PATENT DOCUMENTS

| | | | |
|---|---|---|---|
| 8,053,726 B2 * | 11/2011 | Nakasuji et al. | 250/310 |
| 8,368,018 B2 * | 2/2013 | Hatakeyama et al. | 250/310 |
| 2009/0032723 A1 | 2/2009 | Fukaya et al. | |
| 2009/0039264 A1 | 2/2009 | Ikegami et al. | |
| 2009/0084954 A1 | 4/2009 | Ezumi et al. | |

FOREIGN PATENT DOCUMENTS

| | | |
|---|---|---|
| JP | 2009-043936 A | 2/2009 |
| JP | 2009-099540 A | 5/2009 |

\* cited by examiner

SCANNING ELECTRON MICROSCOPE AND SAMPLE OBSERVATION METHOD

RELATED APPLICATIONS

This application is the U.S. National Phase under 35 U.S.C. §371 of International Application No. PCT/JP2011/002300, filed on Apr. 20, 2011, which in turn claims the benefit of Japanese Application No. 2010-106084 filed on May 6, 2010, and Japanese Application No. 2011-002650 filed on Jan. 11, 2011, the disclosures of which Applications are incorporated by reference herein.

TECHNICAL FIELD

The present invention relates to a scanning electron microscope that irradiates a sample with an electron beam to inspect and measure the sample. The present invention also relates to a sample observation method.

BACKGROUND ART

In recent years, the opening diameter of a contact hole for achieving interlayer conduction in semiconductor devices is microminiaturized as the semiconductor devices are highly integrated and miniaturized. Therefore, it has become increasingly difficult to perform an etching process for contact hole formation. Consequently, inspection and measurement processes for determining whether the contact hole is good have become increasingly important for process development.

A known technology for making it easy to observe a contact hole with a scanning electron microscope is disclosed, for instance, in Patent Document 1. This technology (hereinafter referred to as the precharge technology or the preliminary charge technology) makes it possible to observe the contact hole by preliminarily irradiating a sample with an electron beam before inspection and measurement to form a desired charge in advance and then irradiating the sample with an electron beam at the time of image acquisition to extract electrons from the contact hole. To positively charge the sample during a precharge, it is necessary to ensure that a secondary electron generation efficiency $\delta$, which is the ratio of a secondary electron generation amount to a primary electron beam irradiation amount, is higher than 1. The secondary electron generation efficiency $\delta$ has a correlation with a primary electron beam irradiation potential. Patent Document 1 describes a technology for performing a precharge process under conditions different from those for contact hole observation and observing the contact hole without decreasing a charge efficiency and without increasing the length of processing time.

When the above-mentioned precharge process is performed, an electron beam may drift due to a nonuniform charge. Patent Document 2 describes a technology for using a larger electron beam diameter for charge formation than an electron beam diameter for image acquisition.

In addition, a three-dimensional integrated memory device is known as a next-generation device that inhibits the cost of development and manufacture from being unduly increased by high integration and miniaturization of semiconductor memory devices. This next-generation device is described, for instance, in Non-Patent Document 1.

PRIOR ART LITERATURE

Patent Documents

Patent Document 1: JP-2000-200579-A
Patent Document 2: JP-2009-99540-A

Non-Patent Document

Non-Patent Document 1: "Bit Cost Scalable Technology with Punch and Plug Process for Ultra High Density Flash Memory" 2007 Symposium on VLSI Technology Digest of Technical Papers, p. 14

SUMMARY OF THE INVENTION

Problem to be Solved by the Invention

A conventional precharge technology forms a charge by scanning a sample with a primary electron beam. Basically, electron beam irradiation occurs in a precharge execution region without changing the angle of incidence. Meanwhile, many samples observed with a scanning electron microscope have a certain pattern of surface irregularities. Therefore, when a sample having surface irregularities is observed, an unirradiated region, which is not irradiated with an electron beam, is formed on the sample depending on the angle of incidence of the primary electron beam. This results in the failure to establish a uniform charge state. This problem is particularly serious when an attempt is made to acquire the image of a sample having significant surface irregularities such as a contact hole having a great aspect ratio.

An object of the present invention is to provide a scanning electron microscope or precharge method that makes it possible to form a highly uniform charge in the plane of a sample even when it has surface irregularities.

Means for Solving the Problem

The present invention defines a region containing an image acquisition region as a precharge region and solves the above problem by performing a scan in a plurality of directions within the precharge region. When a scan is to be performed in a plurality of directions, irradiation conditions for the primary electron beam may be set in such a manner that the angle of incidence varies from one scanning direction to another.

Alternatively, the present invention solves the above problem by performing a plurality of scans in the precharge region while varying the angle of incidence of the primary electron beam with respect to the sample.

Still alternatively, the present invention solves the above problem by setting a ring-shaped scanning region containing the precharge region before performing a primary electron beam scan in the precharge region and then executing a precharge operation while altering the ring-shaped scanning region in such a manner as to decrease its inside diameter.

When the above precharge method is to be implemented in an apparatus, the angle of inclination of an electron beam used for a precharge operation and an irradiative scan time setting for each scanning direction should be variable.

Advantages of the Invention

The present invention makes it possible to establish a more uniform charge state than a conventional precharge method does, thereby acquiring a higher-quality image.

MODE FOR CARRYING OUT THE INVENTION

A precharge method provided by the present invention will now be described in conjunction with a first embodiment, a second embodiment, a third embodiment, and a fourth embodiment. Operation screens used to select a function when a precharge technology provided by the present invention is applied to a scanning electron microscope apparatus will be described in conjunction with a fifth embodiment. The term "scanning electron microscope apparatus" represents an apparatus that acquires an image with a scanning electron microscope. Not only a general-purpose scanning electron microscope but also a defect review apparatus and an appearance inspection apparatus are regarded as a scanning electron microscope apparatus as far as it acquires an image with a scanning electron microscope.

First Embodiment

Figure 1:
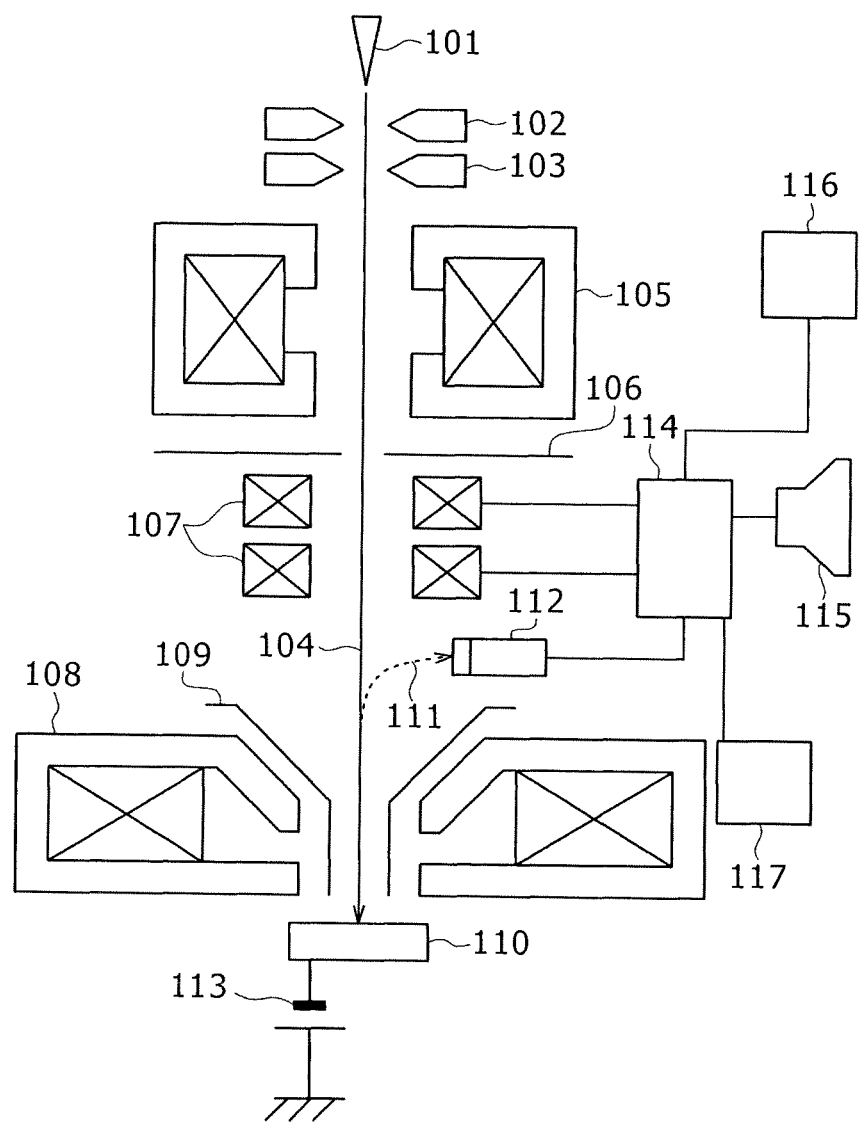
FIG. 1 is a diagram illustrating the configuration of a scanning electron microscope provided by the present invention.

An exemplary configuration of a scanning electron microscope according to a first embodiment of the present invention is shown in FIG. 1. FIG. 1 is a schematic diagram illustrating a typical retarding field scanning electron microscope apparatus. When a voltage is applied to an extraction electrode 102, an electron beam 104 extracted from an electron source 101 is passed through an anode 103 and accelerated. The electron beam 104 accelerated by the anode is then converged by a condenser lens 105 and narrowed down to a predetermined amperage by an aperture 106. Further, an alignment coil (not shown) and an astigmatism correction coil (not shown) subject the electron beam to axial correction and astigmatism correction. The corrected electron beam is then converged on a sample 110 by an objective lens 108.

A dual deflector 107 two-dimensionally scans the sample 110 with the electron beam 104 in X- and Y-directions. Secondary electrons 111 emitted from the sample are then drawn into a detector 112, which is positioned above the sample. The detector 112 can also detect backscattered electrons as signal electrons to be detected. Light emitted when the secondary electrons 111 collide with a scintillator disposed in the detector 112 is amplified by a photomultiplier, subjected to brightness and contrast corrections in a control section 114, and used as brightness information about an image to be displayed on a display section 115. The control section 114 controls the electrical current and voltage of each section of the scanning electron microscope and provides image acquisition control. FIG. 1 merely indicates that the control section 114 is connected to the deflector 107 and to the detector 112. In reality, however, the control section 114 is also connected to the other electrooptical elements such as the condenser lens 105 and the objective lens 108. When the backscattered electrons are to be detected, a metal reflective plate may be used to convert the backscattered electrons to secondary electrons.

A booster electrode 109 is disposed in a path of the objective lens 108 to apply a positive voltage. Chromatic aberration caused by the objective lens 108 can be reduced by accelerating the electron beam 104 that passes through the objective lens 108. The booster electrode 109 acts as a pull-up electrode with respect to the secondary electrons 111 and introduces the secondary electrons 111 into the path of the objective lens 108.

A retarding power supply 113 applies a negative voltage to the sample 110, thereby decelerating the electron beam 104. As the electron beam 104 is highly accelerated when it travels to the vicinity of the sample 110, it is not readily affected by electromagnetic field noise. Further, a sharp electron beam 104 can be obtained by reducing the chromatic aberration that is caused when the electron beam 104 passes through each lens. In the above-described retarding field scanning electron microscope, an acceleration voltage ($V_{LAND}$) for the electron beam 104 incident on the sample can be expressed as indicated below.

$$V_{LAND} = \text{anode(103)acceleration voltage}(V_{GUN}) - \text{retarding voltage}(V_{RET}) \qquad \text{Equation (1)}$$

A later-described scanning electron microscope (defect review apparatus), which checks for and observes defects in a sample, compares images to locate a defect, and picks up an image at an increased magnification, for instance, to classify and analyze the defect. The defect review apparatus is often provided with an appearance inspection apparatus that usually inspects the sample at a high speed to locate a defect candidate at a preliminary stage of an inspection process, and is connected to the appearance inspection apparatus either directly or via a network. A portion having the defect candidate located by the appearance inspection apparatus is imaged. The portion having the defect candidate is then imaged at higher magnification and at higher quality for observation purposes. The defect review apparatus includes storage means 116, control means (not shown), and an image processing section 117 in addition to the aforementioned components of the scanning electron microscope. The storage means 116 stores defect candidate data received from the appearance inspection apparatus. The control means provides scrolling in accordance with the defect candidate data. The image processing section 117 compares and analyzes picked-up images. The second to fourth embodiments are similar to the first embodiment in the overall configuration of the scanning electron microscope. Like elements in the first to fourth embodiments will not be redundantly described.

A method of observing a contact hole with a scanning electron microscope through the use of a conventional technology will now be described. When, for instance, a contact hole is to be observed, it may be necessary to irradiate a sample with an electron beam in advance to form a desired charge before performing a scan for image acquisition. This charge forming operation before scanning for image acquisition is called a precharge. A region to be precharged is either defined by a user before observation or automatically defined in accordance with an image acquisition region. The region to be precharged is called a precharge region. The precharge region should be defined so as to include a region where image acquisition is needed.

When irradiating the sample 110 with the electron beam 104 to form a positive charge or a negative charge, it is necessary to consider a secondary electron generation efficiency 5, which is the ratio of the generation amount of the secondary electrons 111 to the irradiation amount of the electron beam 104. If $\delta$ is equal to 1, no charge is formed because there is a balance between the number of electrons incident on the sample 110 and the number of electrons emitted from the sample 110. If $\delta$ is higher than 1, the surface of an insulator is positively charged because the number of emitted electrons is larger than the number of electrons incident on the sample 110. If, on the other hand, $\delta$ is lower than 1, the insulator surface is negatively charged because the number of electrons incident on the sample 110 is larger than the number of electrons emitted from the sample 110. Although the secondary electron generation efficiency $\delta$ varies with the substance on the surface of the sample, it correlates with the acceleration voltage ($V_{LAND}$). In general, $\delta$ is equal to 1 when the acceleration voltage is close to 30 V or 1 kV, lower than 1 when the acceleration voltage is 30 V or lower or 1 kV or higher, and higher than 1 when the acceleration voltage is between 30 V and 1 kV.

If a positive charge is formed on the surface of the sample 110, the secondary electrons 111 generated at the bottom of the contact hole are pulled up to the surface of the sample 110. Therefore, the secondary electrons 111 generated at the bottom of the contact hole are easily detected so that the information about the bottom of the contact hole is acquired. If, on the other hand, a negative charge is formed, the secondary electrons generated at the bottom of the contact hole cannot be detected because their detection is obstructed by the negative charge. However, if a nonpenetrating portion of an insulating film exists due, for instance, to etching failure, it is possible to detect only the secondary electrons generated at the bottom of such a fault. This feature is effective for checking for defects. The first embodiment and the later-described embodiments are both applicable to a precharge method no matter whether it forms a positive charge or a negative charge.

As described above, the precharge is performed before image acquisition to irradiate the sample with an electron beam for the purpose of charging the sample positively or negatively. Secondary electrons or backscattered electrons, which are generated when the sample is irradiated with an electron beam during the precharge, are not required for image formation. Therefore, when the precharge is performed, a detected signal from the detector 112 is not used for image formation.

A conventional technology for reducing the processing time required for a precharge is described in Patent Document 1. This conventional technology performs a precharge under conditions different from image acquisition conditions. More specifically, the technology varies the acceleration voltage ($V_{LAND}$) by controlling the anode acceleration voltage ($V_{GUN}$) or the retarding voltage ($V_{RET}$) for the purpose of optimizing the secondary electron generation efficiency $\delta$. The technology also controls the crossover of the condenser lens 105 to vary the amperage of the electron beam 104 that passes through the aperture 106. A charge process is facilitated in proportion to the secondary electron generation efficiency $\delta$ and the amperage of the electron beam 104. Therefore, increasing the amperage shortens the time required to reach a predetermined charge potential.

The problem with the above-described conventional precharge method will now be described. The following description will be given on the assumption that a typical silicon wafer 201 is used as a sample. An insulating film 202 is formed on the silicon wafer 201. A part of the insulating film 202 is etched to form a contact hole. When the surface of the sample is irradiated with an electron beam 203 under conditions where the secondary electron generation efficiency $\delta$ is higher than 1, a positive charge 204 is formed in an irradiated region where the electron beam 203 is incident on the insulating film 202. In an unirradiated region, on the other hand, no charge is formed, or even if a charge is formed, the unirradiated region differs from the irradiated region in charge potential.

Figure 2:
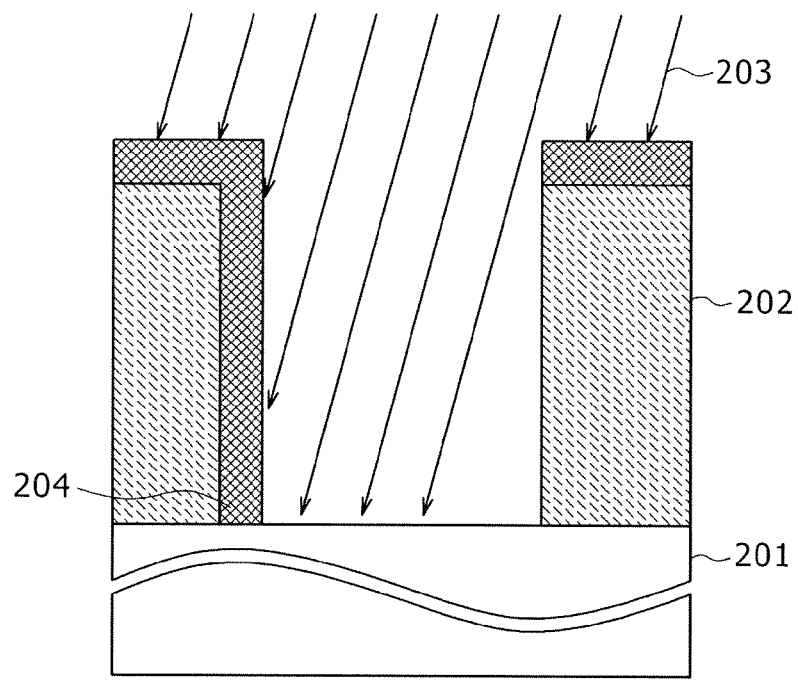
FIG. 2 is a diagram illustrating a contact hole observation problem caused by a conventional technology.

If, as shown in FIG. 2, the electron beam 203 is tilted when it is incident on the sample, the positive charge 204 is formed on the entire flat surface of the insulating film 202. In the contact hole, however, an unirradiated region where the electron beam is not incident exists because the electron beam is tilted. This results in a nonuniform charge in the contact hole. Consequently, the secondary electrons (not shown) generated at the bottom of the contact hole are affected by a horizontally-oriented electric field. Hence, the secondary electrons may fail to reach the surface of the insulating film 202 and become lost on the wall surface of the contact hole. As a result, the information about the bottom of the contact hole may not be acquired. Further, the incident electron beam 203 itself is also deflected by the horizontally-oriented electric field. Therefore, the center of the bottom is offset with respect to the opening of the contact hole so that a tilted image is obtained. The electron beam 203 may be tilted not only by, for example, deflection for an axial correction by the alignment coil, but also by electron beam scanning. The tilt of the electron beam 203 is unavoidable due to the principles of a scanning electron microscope. The permissible value of the tilt decreases with an increase in the aspect ratio (opening diameter/depth) of the contact hole.

As for the defect review apparatus, which conducts a review to check for semiconductor defects, the above-described problem exerts a serious influence upon particularly their product performance. The defect review apparatus acquires a high-definition image of a defect on a semiconductor sample (generally a silicon wafer) automatically and at high speed in accordance with inspection data derived from an optical or electron-beam-based semiconductor inspection apparatus. As the image acquisition magnification of the defect review apparatus is generally higher than the inspection magnification of the semiconductor inspection apparatus, it may be necessary in some cases to correct an error in a defect position derived from the inspection data. A procedure to follow in such an instance is to acquire an image at low magnification, locate a defect through image processing, and acquire the image of the defect at high magnification. The contact hole is observed by performing a precharge to form a charge, locating a defect with a low-magnification image, and acquiring a high-magnification image centered with respect to the defect. However, the earlier-described conventional technology fails to acquire a desired image if the electron beam is tilted, and requires a significant amount of time to prevent the electron beam from being tilted. This problem is unique to the defect review apparatus because it cannot locate a defect, which is to be observed, until it completes a precharge.

A method of avoiding the problem caused by the above-described tilt of the electron beam 203 during the use of the conventional technology would be to place the contact hole, which is to be observed, at a position at which the electron beam 203 is vertically incident. Theoretically, the position at which the electron beam 203 is vertically incident is a position unaffected by deflection, namely, the center of an electron microscope image (hereinafter referred to as the image). In reality, however, the center of the image is not always free of deflection due, for instance, to deflection for an axial correction by the alignment coil. As such being the case, an electron beam irradiation sequence and a contact hole observation sequence need to be repeated in order to form a charge a number of times and search the image for an optimum location at which the electron beam 203 is not tilted. However, such an approach still poses a problem because of a complicated observation procedure and an unduly long period of processing.

Figure 3A:
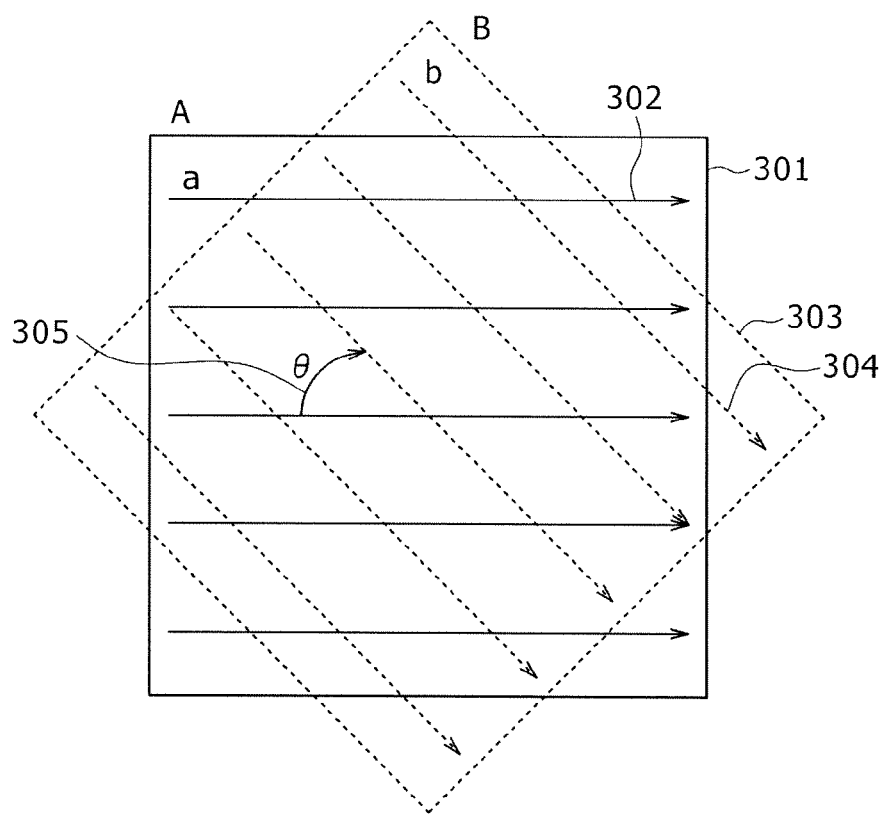
FIG. 3A is a diagram illustrating a method of changing the direction of electron beam scanning at fixed time intervals during a precharge in accordance with a first embodiment of the present invention.

A precharge method according to the first embodiment will now be described with reference to FIG. 3A. The first embodiment relates to a technology for changing the direction of electron beam scanning at predetermined time intervals during a precharge. Changing the direction of electron beam scanning as mentioned above is hereinafter referred to as raster rotation. As shown in FIG. 3A, electron beam scanning region A 301, which is in an initial state, is irradiated in electron beam scanning direction a 302 for a period of time t with an electron beam placed under desired charge formation conditions. Electron beam scanning region A 301 is then rotated through a predetermined angle θ 305 so that next-step electron beam scanning region B 303 is irradiated in electron beam scanning direction b 304 for a period of time t with the electron beam. Subsequently, a process of rotating the electron beam scanning region through an angle of θ 305 and irradiating the electron beam scanning region for a period of time t with the electron beam is repeatedly performed. When predefined termination conditions are met, a precharge process, which is described above, is terminated. The termination conditions may be predefined in terms of total irradiation time or of the sum of angles θ 305.

Figure 3B:
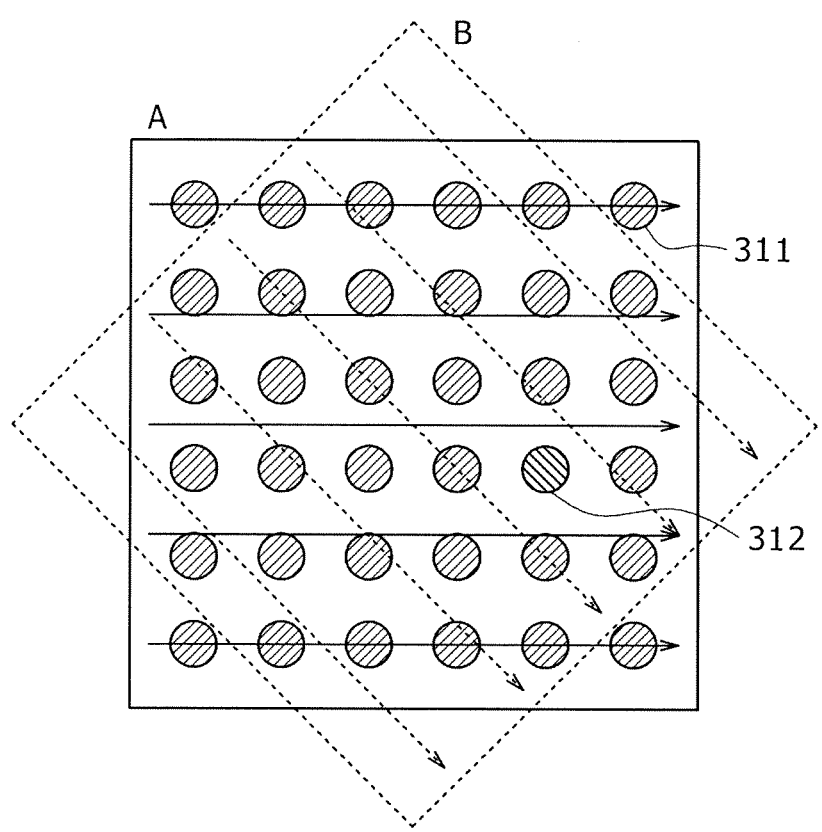
FIG. 3B is a diagram illustrating advantages that are provided by the first embodiment during contact hole observation.

FIG. 3B shows an example in which the method depicted in FIG. 3A is used to perform a precharge with respect to a portion on the sample 110 in which contact holes are serially disposed. When a positive charge is formed by the precharge, the bottom of a nondefective portion 311 of a contact hole increases its brightness. Meanwhile, the bottom of a defective portion 312 of the contact hole is not open due to a residual insulating film so that a signal at the bottom of the contact hole cannot be acquired. As a result, the bottom of the defective portion 312 of the contact hole of relatively decreases its brightness. In this manner, the defect review apparatus can locate a defect.

In a typical scanning electron microscope shown in FIG. 1, a deflector 107 is provided in each of X- and Y-directions. The orientation of the deflector 107 is determined so that the X- and Y-directions of the sample coincide with a scanning direction under certain reference electrooptical conditions. Meanwhile, if the crossover of the condenser lens 105 is controlled to vary the amperage of the electron beam 104 passing through the aperture 106 or the amperage of the objective lens 108 is varied to compensate for changes in the height of the sample 110, the rotation angle of the electron beam 104 passing through the lens varies so that the scanning direction may not coincide with the X- and Y-directions of the sample 110. To compensate for the above-mentioned rotation of the scanning direction, a deflection current control circuit provided in the control section 114 generally exercises control in which the rotation angle is reflected. In a precharge performed for contact hole observation, a raster rotation was conducted in the past to optimize the scanning direction relative to the shape of a pattern on the sample 110. However, such a raster rotation was merely conducted before or after the precharge. Therefore, there was the problem of an electron beam tilt, which was described in conjunction with the conventional technology. On the other hand, the precharge method depicted in FIG. 3A changes the rotation angle as needed during the precharge so that a precharge scan is performed in a plurality of scanning directions with respect to one point. This makes it possible to form a more uniform charge in the plane of a sample than the conventional precharge method does. The scanning direction need not always be rotated by the deflection current control circuit in the control section 114. An alternative, for example, is to use a rotation mechanism added to a stage on which the sample 110 is mounted or use a mechanism added to rotate the deflector itself. However, the use of a mechanism added to the stage or to the deflector may displace the center of rotation from the center of an image while the raster rotation provides centrally symmetric rotation with respect to the image. Therefore, when cost and complicated control are taken into account, it is easier to use a method based on raster rotation. Moreover, an electrostatic deflector may be installed separately from an electromagnetic deflector.

Figure 4:
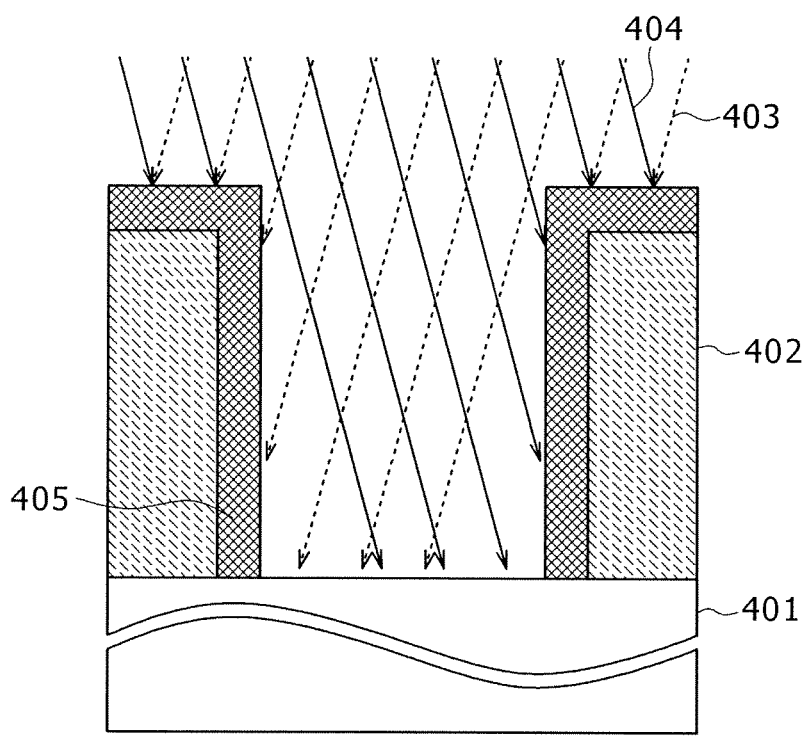
FIG. 4 is a diagram illustrating advantages provided by the first embodiment.

FIG. 4 shows an example in which the technology for conducting a raster rotation during a precharge, which is shown in FIG. 3A, is applied to the contact hole structure shown in FIG. 2. A precharge is performed for an insulating film 402 formed on a silicon wafer 401 in an electron beam irradiation direction 403 in an initial state (t=0) of a precharge process. After the elapse of time t, the irradiation direction is rotated through an angle of θ 305 so as to perform a precharge for a period of time t in a next-step electron beam irradiation direction 404. During the precharge process, a positive charge 405 is formed in a region where an electron beam is incident on the insulating film 402. In the present embodiment, it is assumed, for convenience of illustration, that the rotation angle θ is 180 degrees. As irradiation is performed while changing the direction of electron beam irradiation, the positive charge 405 is additionally formed in a region where the positive charge 405 was not formed when unidirectional electron beam irradiation was performed as shown in FIG. 2. As a result, the positive charge 405 is uniformly formed on the inner wall of the contact hole. Although the present embodiment is described on the assumption that the rotation angle θ is 180 degrees, it is obvious that the angle θ may take any value. It is also possible to adopt conditions under which, after completion of a number of steps, the sum of angles θ is 360 degrees or more, namely, the visual field makes at least one revolution. Another alternative is to vary the length of time allocated to each step and set the processing time through a GUI on an individual basis depending on the irradiation direction. This makes it possible to proceed to the next step before the electron beam irradiation in the present step affects the entire precharge region. However, when the length of time allocated to each step is not fixed, the positive charge 405 may not be uniformly formed on the insulating film 402. Therefore, the conditions should be determined in consideration of the amperage of the electron beam incident on the sample and the speed of electron beam scanning.

As regards the inner wall of the contact hole, the elevation angle at which secondary electrons generated by electron beam irradiation can escape from the contact hole is limited. Therefore, the amount of a charge formed on the contact hole inner wall is not always the same as the amount of a charge formed on the surface of the insulating film 402. However, the potential distribution in the direction of height does not impart lateral deflection to the secondary electrons generated at the bottom of the contact hole. Further, as the potential distribution itself raises the secondary electrons to the surface of the insulating film 402, contact hole observation remains unobstructed. As described above, conducting the raster rotation during the precharge makes it possible to avoid the problem of an electron beam tilt, which is encountered when the conventional technology is used for contact hole observation, and observe the contact hole easily and rapidly. Moreover, an electrostatic deflector may be installed separately from an electromagnetic deflector.

Although the above description is given on the assumption that a contact hole is to be observed, the present invention is not limited to contact hole observation. Three-dimensional structures formed on an insulating film on a sample include, for example, a groove-shaped structure in addition to the contact hole. It is obvious that the same advantages will be obtained as described in conjunction with the later-described embodiments even when the present invention is applied to such three-dimensional structures. The above is also true for the later-described embodiments of the present invention.

Second Embodiment

A second embodiment of the present invention will now be described. The second embodiment solves the problem with the conventional technology without resort to the first embodiment. The second embodiment solves the problem of a nonuniform charge in the contact hole due to the tilt of the electron beam by controlling the angle of electron beam incidence on the sample during a precharge. The second embodiment will be described on the assumption that one point of the sample is scanned a number of times in the same scanning direction by an electron beam for a precharge. The scan is conducted a number of times so that the angle of electron beam incidence on the one point varies.

Figure 5:
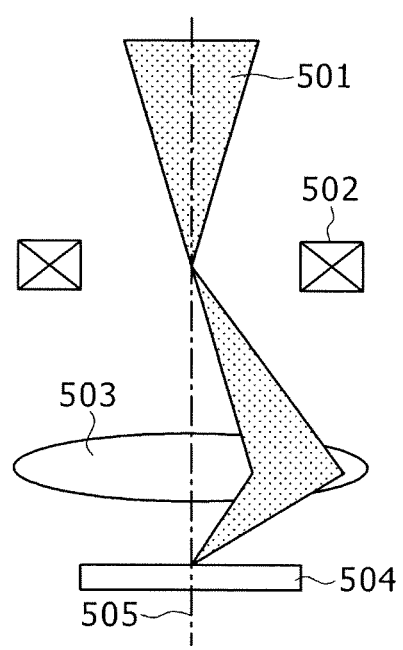
FIG. 5 is a diagram illustrating the configuration of the scanning electron microscope according to a second embodiment of the present invention.

FIG. 5 is a diagram illustrating a scanning electron microscope that incorporates an electron beam tilt technology. The scanning electron microscope has the same overall configuration as described in conjunction with the first embodiment. In the second embodiment, too, the electrooptical components such as aligners and a deflector are controlled by the control section. In the example shown in FIG. 5, aligners 502 are disposed to match the object point of an electron beam 501 that is incident on an objective lens 503. The electron beam 501 passing through the objective lens 503 is converged to one point on a sample 504 no matter whether deflection is provided by the aligners 502. In the example, the electron beam 501 is deflected by the aligners 502. Next, the electron beam 501 is made incident on an off-axis portion of the objective lens 503, which is displaced from an optical axis 505. The electron beam 501 is then tilted and incident on the sample 504 due to the converging action of the objective lens 503. The tilt angle is determined by multiplying the angle of deflection provided by the aligners 502 by the reciprocal of a reduction ratio provided by the objective lens 503. In general, the objective lens 503 in an electron microscope provides a very large reduction ratio of approximately 10× to 100×. Therefore, a large tilt angle can be provided without having to increase the amount of deflection provided by the aligners 502.

However, in an apparatus for acquiring an image under a plurality of different sets of electrooptical conditions, the object point of the objective lens 503 may not match the aligners under all sets of conditions. In such an instance, two sets of the aligners 502 should be disposed one above the other so that they provide deflection in opposite directions. Further, the deflection amount ratio between the two sets of the aligners 502 should be controlled so that a deflection fulcrum virtually matches the object point of the objective lens 503, thereby preventing the deflection position on the surface of the sample 504 from being changed by the tilt of the electron beam 501. Although only on set of the aligners 502 is shown in FIG. 5 for convenience of illustration, it is obvious that the present embodiment is not limited to the use of only one set of aligners. In general, a plurality of sets of aligners are disposed so as to provide bidirectional tilt control in X- and Y-directions to control not only a tilt angle (the angle from the vertical direction of the sample 504) but also an azimuth angle (the clockwise or counterclockwise angle formed when the sample 504 is viewed from vertically above). It is assumed that the tilt angle and azimuth angle are both taken into account to define the angle of electron beam incidence.

The settings for the tilt angle, the azimuth angle, and the timing at which switching is effected between these two angles may be preset to fixed values. An alternative is to let the display section display a GUI that permits the use of user-defined values, as described later.

Figure 6A:
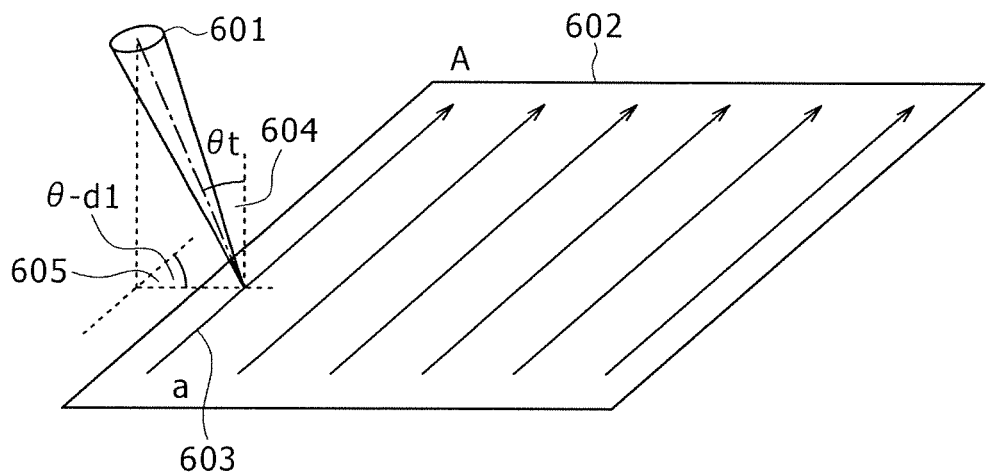
FIG. 6A is a diagram illustrating a precharge method according to the second embodiment.
Figure 6B:
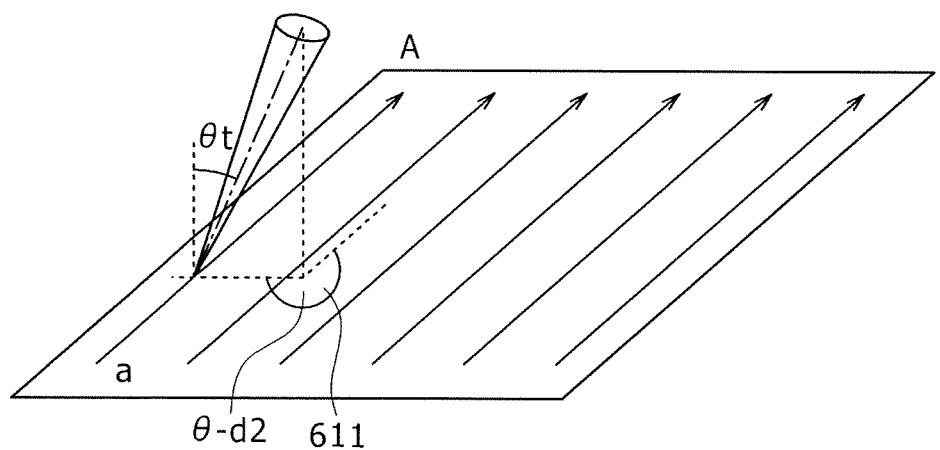
FIG. 6B is a diagram illustrating the precharge method according to the second embodiment.

The precharge method according to the present embodiment will now be described with reference to FIGS. 6A and 6B. The present embodiment relates to a technology for changing the angle of electron beam incidence at predetermined time intervals during a precharge. As shown in FIG. 6A, precharge region A 602 is irradiated in electron beam scanning direction a 603 with an electron beam 601 placed under desired charge formation conditions. In this instance, irradiation is performed for a period of time t at an azimuth angle θ-d1 605 while the electron beam tilt angle θt 604 is fixed. Next, irradiation is performed for a period of time t at a different azimuth angle θ-d2 611 as shown in FIG. 6B. Subsequently, irradiation is similarly repeated for a period of time t while sequentially changing the azimuth angle. The precharge process is terminated when predefined termination conditions are met. The azimuth angle settings for the above-described repeated operations should be determined so as to include a precharge performed at an azimuth angle 180 degrees from the initial azimuth angle θd-1 605 in order to perform a precharge with respect to the contact hole in different electron beam irradiation directions as shown in FIG. 4.

The use of the above-described technology makes it possible to uniformly form the positive charge 405 on the inner wall of the contact hole, as is the case with the first embodiment. In the present embodiment, the electron beam is made incident at a plurality of different angles of incidence. Therefore, a uniform charge can be formed although the scanning direction for one point of the sample remains unchanged. Although the present embodiment has been described on the assumption that the electron beam tilt technology is applied only to the control of the azimuth angle, an alternative is to additionally vary the tilt angle with time. If the charge distribution becomes nonuniform during a charge formation process due, for instance, to pattern irregularities in the precharge region, the above-mentioned alternative makes it possible to cancel an electron beam tilt caused by a horizontally-oriented electric field that arises from the nonuniform charge distribution. Hence, a desired point can be irradiated in a desired direction with an electron beam for a precharge. This will maintain a uniform charge state in the contact hole.

Third Embodiment

Figure 7A:
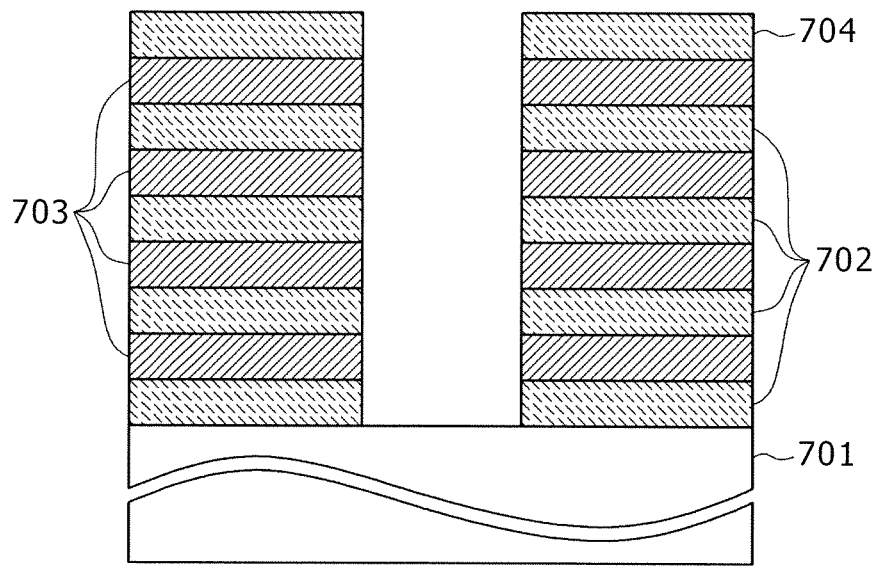
FIG. 7A is a diagram illustrating a multi-layer sample having insulating layers and silicon layers.
Figure 7B:
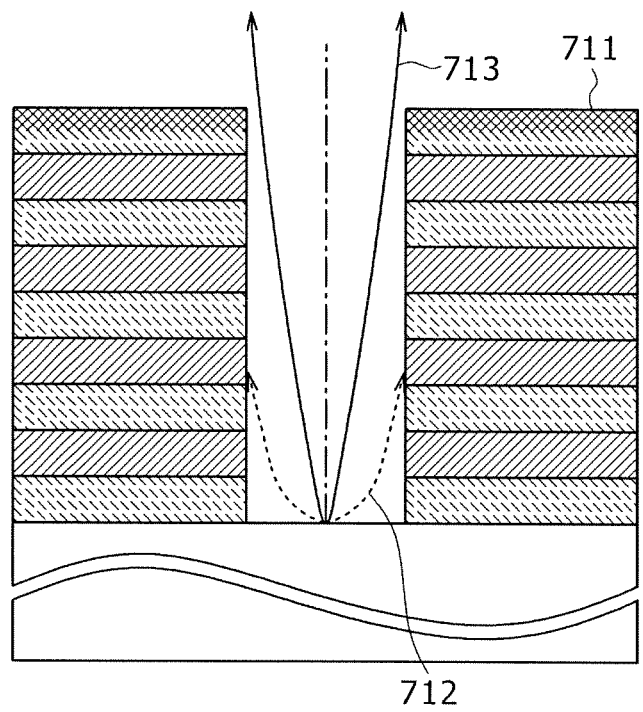
FIG. 7B is a diagram illustrating a conventional technology problem that is to be solved by a third embodiment of the present invention.

A third embodiment of the present invention will now be described. First of all, the problem to be solved by the third embodiment and the principles of means for solving the problem will be described with reference to FIGS. 7A to 7C. FIG. 7A shows a sample that is obtained by repeatedly and alternately forming an insulating layer 702 and a silicon layer 703, which contains impurities, on a silicon wafer 701 and then forming an insulating film 704 on the resulting uppermost surface. If the conventional technology is used to perform a precharge with respect to a contact hole made in the above sample while the electron beam is not tilted, a positive charge 711 is formed on the uppermost insulating film 704 as shown in FIG. 7B. When a precharge is performed by using the conventional technology, a positively charged electric field raises the secondary electrons generated at the bottom of the contact hole to make it possible to observe the contact hole. In the sample shown in FIGS. 7A to 7C, however, the silicon layer 703 exists as an intermediate layer. Thus, no charge is formed because an electrical charge provided by the electron beam incident on the silicon layer 703 rapidly diffuses. Hence, the electric field does not permeate into the bottom of the contact hole. Consequently, low elevation angle secondary electrons 712 generated at the bottom of the contact hole fail to reach the surface of the sample and become lost on the inner wall of the contact hole, whereas high elevation angle secondary electrons 713 generated at the bottom of the contact hole reach the surface of the sample and may act as a detector signal.

When the aspect ratio of the contact hole is 20, an elevation angle component that can geometrically reach the surface of the sample is calculated as indicated below.

$$\tan^{-1}\left(\frac{1}{20}\right) = 2.86° \quad \text{Equation (2)}$$

In reality, however, the value derived from Equation (2) is not always correct because the secondary electrons are affected, for instance, by a retarding electric field, a pull-up electric field generated by the booster electrode 109, and a charge formed on the inner wall of the contact hole. In any case, the amount of secondary electrons classified as the high elevation angle secondary electrons shown in FIG. 7B is extremely small and inappropriate for contact hole observation. The above-described problem arises when the conventional technology is used to observe the contact hole made in the sample shown in FIGS. 7A to 7C.

Advantages provided by the present invention will now be described with reference to FIG. 7C. The precharge technology described in conjunction with the first or second embodiment can be used to perform a precharge according to the third embodiment. When the present invention is applied, a precharge can be performed to uniformly charge the inner wall of the contact hole so that a positive charge 722 is formed not only on the uppermost insulating film 704 but also on the intermediate insulating layer 702. Hence, the secondary electrons generated at the bottom of the contact hole are raised toward the surface of the sample. In addition, the secondary electrons are converged because they are once decelerated by the intermediate silicon layer 703, which serves as a ground potential. This sequence is repeated a number of times equal to the number of intermediate layers. Therefore, the amount of secondary electrons 721 that reach the surface of the sample and act as a detector signal is tremendously larger than when the conventional technology is used. A structure in which the insulating layer 702 having a potential is sandwiched by the silicon layer 703 having no potential is similar to an einzel lens, which is an electrostatic lens commonly used in a scanning electron microscope.

In other words, when the present invention is applied to a sample that is formed by repeatedly and alternately forming an insulator and a semiconductor layer as described in conjunction with the present embodiment, an electrostatic lens is formed in the sample to converge secondary electrons generated at the bottom of the contact hole. This makes it possible to observe the bottom of a hole in a device formed by repeatedly and alternately forming the insulating layer 702 and the silicon layer 703 although such an observation cannot be made by using the conventional technology.

Figure 7C:
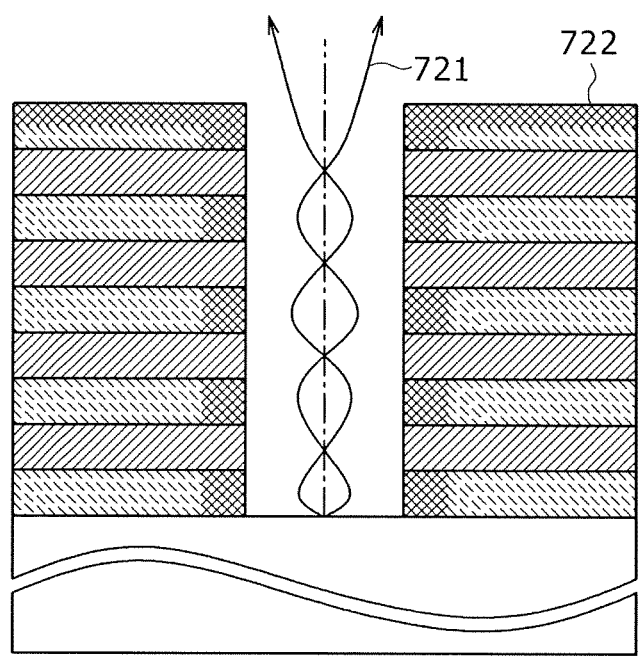
FIG. 7C is a diagram illustrating advantages provided by the third embodiment.

To form the positive charge 722 shown in FIG. 7C, it is necessary to irradiate the inner wall of the contact hole with an electron beam. Therefore, it is demanded that the electron beam be tilted. However, as described in connection with the conventional technology problem, the electron beam is tilted even when an axial correction is made by an alignment coil that passes the electron beam through a lens center. Therefore, the positive charge 722 can be formed as shown in FIG. 7C simply by using the technology according to the first embodiment of the present invention. However, as indicated in Equation (2), if the contact hole has a high aspect ratio in a situation where the angle of an electron beam tilt is several degrees or larger, it is difficult to irradiate the inner wall near the bottom of the contact hole with an electron beam. Therefore, the electron beam tilt technology should be used in addition to the technology according to the first embodiment. Even when the technology according to the second embodiment, which changes the angle of electron beam incidence (tilt angle or azimuth angle) as needed during a precharge, is used, it is necessary to exercise control so that the tilt angle is within the above limits.

When the conventional technology is used for contact hole observation, the effect produced by the application of a tilt angle control technology is limited to the suppression of tilt. On the other hand, when the technology for conducting the raster rotation during a precharge (first embodiment) and the technology for changing the electron beam tilt angle and azimuth angle during a precharge (second embodiment) are used as described in conjunction with the present embodiment, it is possible to exercise tilt angle control in accordance with the aspect ratio of the contact hole and form an optimum positive charge 722 on the inner wall of the contact hole. As a result, the image of the bottom of the contact hole can be acquired although it was previously difficult to acquire such an image.

Fourth Embodiment

The first embodiment performs a precharge by using a common electron beam scanning method, that is, performs a precharge while repeatedly scanning an X-direction line, shifting the scanning position in Y-direction, and scanning the X-direction line again, and then conducts X- and Y-direction scans in a similar manner after changing the scanning direction. When the above X-/Y-direction electron beam scanning method is used, the number of electron beam scans for the center of an image is relatively increased so that the profile of the resulting positive charge is shaped like a convex whose apex is at the center of the precharge region. In the above instance, the electron beam and secondary electrons in a region other than the center of a positively-charged region may be deflected by a horizontally-oriented electric field to the detriment of observation although the severity of the detriment varies with the type of the insulating film and with the structure of the sample.

A fourth embodiment solves the above problem by performing a precharge described in conjunction with the first embodiment in a stepwise fashion with respect to a plurality of ring-shaped regions, which are formed by rotating the electron beam with either the x or y scanning direction fixed. This electron beam scanning method is called a spiral scan.

Figure 8A:
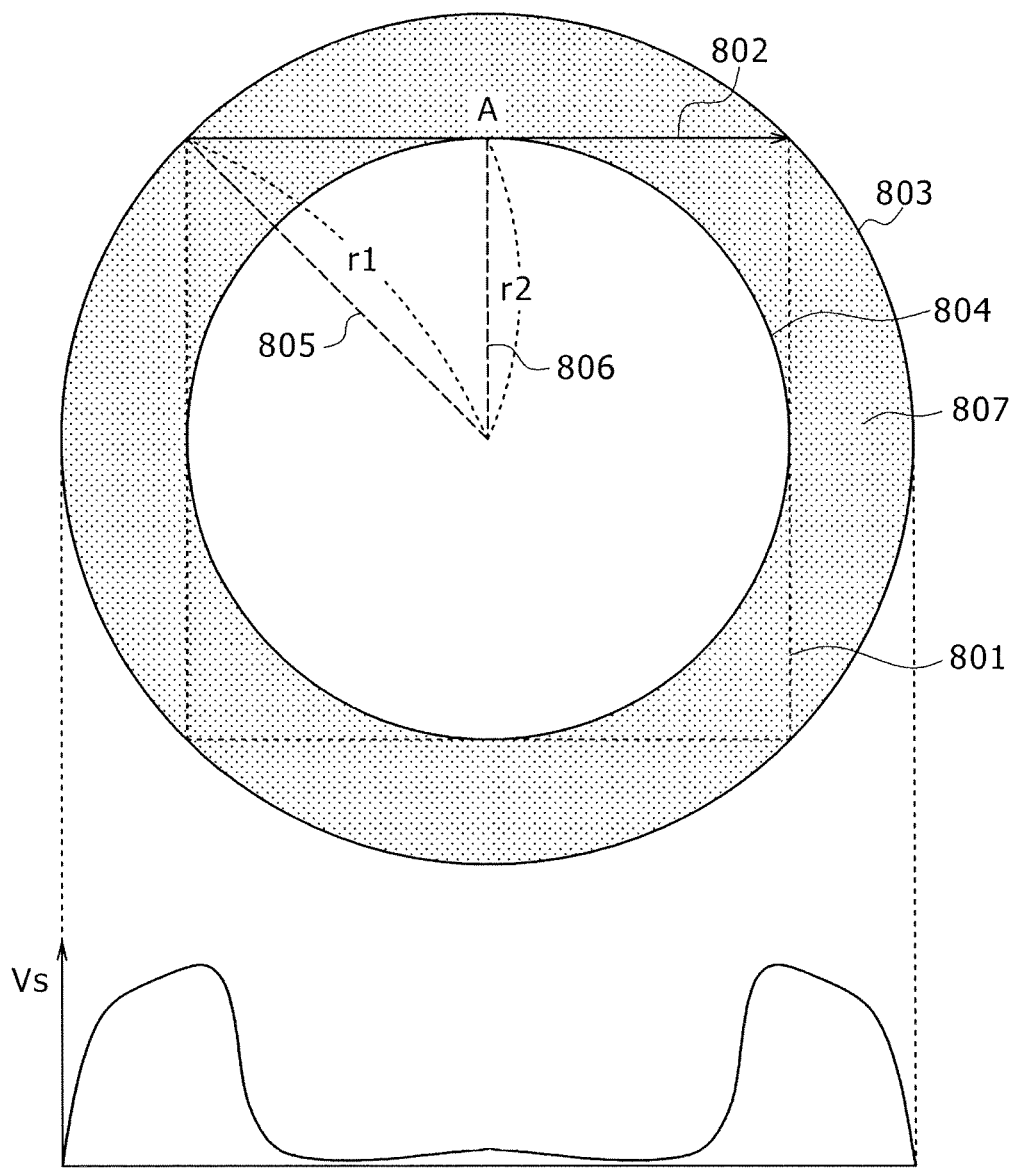
FIG. 8A is a diagram illustrating the precharge method according to a fourth embodiment of the present invention and advantages provided by that precharge method.

The precharge method according to the present embodiment will now be described with reference to FIG. 8. FIG. 8A is a diagram illustrating a region that is irradiated with an electron beam during a precharge. While the Y-direction of an irradiation region 801 for a precharge according to the conventional technology is fixed in a state where an uppermost line 802 is scanned by an electron beam, a raster rotation is conducted to cause a 360-degree rotation during the precharge. A precharge process can then be performed only with respect to ring-shaped region A 807 obtained by subtracting a circle 804 that has a radius r2 806 and inscribes the precharge irradiation region 801, which is centered around an image center, from a circle 803 that has a radius r1 805 and circumscribes the precharge irradiation region 801. In other words, this type of scanning is accomplished by performing a one-dimensional scan with one of two-dimensional scanning parameters fixed (e.g., by performing a scan with respect to the uppermost line 802 while a midpoint of this one-dimensional scanning line is in contact with the circle 804 having the radius r2 806). A first-stage precharge is performed as described above. The lower half of FIG. 8A is a schematic diagram 808 illustrating a positive charge Vs that is formed during the first-stage precharge. Ring-shaped region A has the same center as an observation target and is determined by the length of the uppermost line 802 and the distance from the center.

The electron beam scanning position can be fixed either by adding an offset to the output of an electrical current control circuit or by incorporating a two-stage coil having a deflection capability into the deflector in addition to an electron beam scanning coil, allowing the two-stage coil to cover two directions (X- and Y-directions), and statically applying an electrical current to the two-stage coil. When the former method is used, it is necessary to provide the electrical current control circuit with a common deflection current and with an output tolerance equivalent to the offset. However, the former method simplifies the structure of a scanning electron microscope. On the other hand, the latter method requires each electrical current control circuit to generate a smaller maximum output than the former method. However, the latter method slightly complicates the structure of the scanning electron microscope. Alternatively, an electrostatic deflector may be used. In any case, the defect review apparatus, which produces considerable effects by forming a uniform charge, is naturally capable of offsetting the visual field of an image because it is necessary to correct an error in a defect position determined from inspection data derived from an optical or electron-beam-based semiconductor inspection apparatus. Therefore, fixing either one of the x and y electron beam scanning directions at a specific position, which is essential to the present embodiment, can be accomplished without adding any new control element.

Figure 8B:
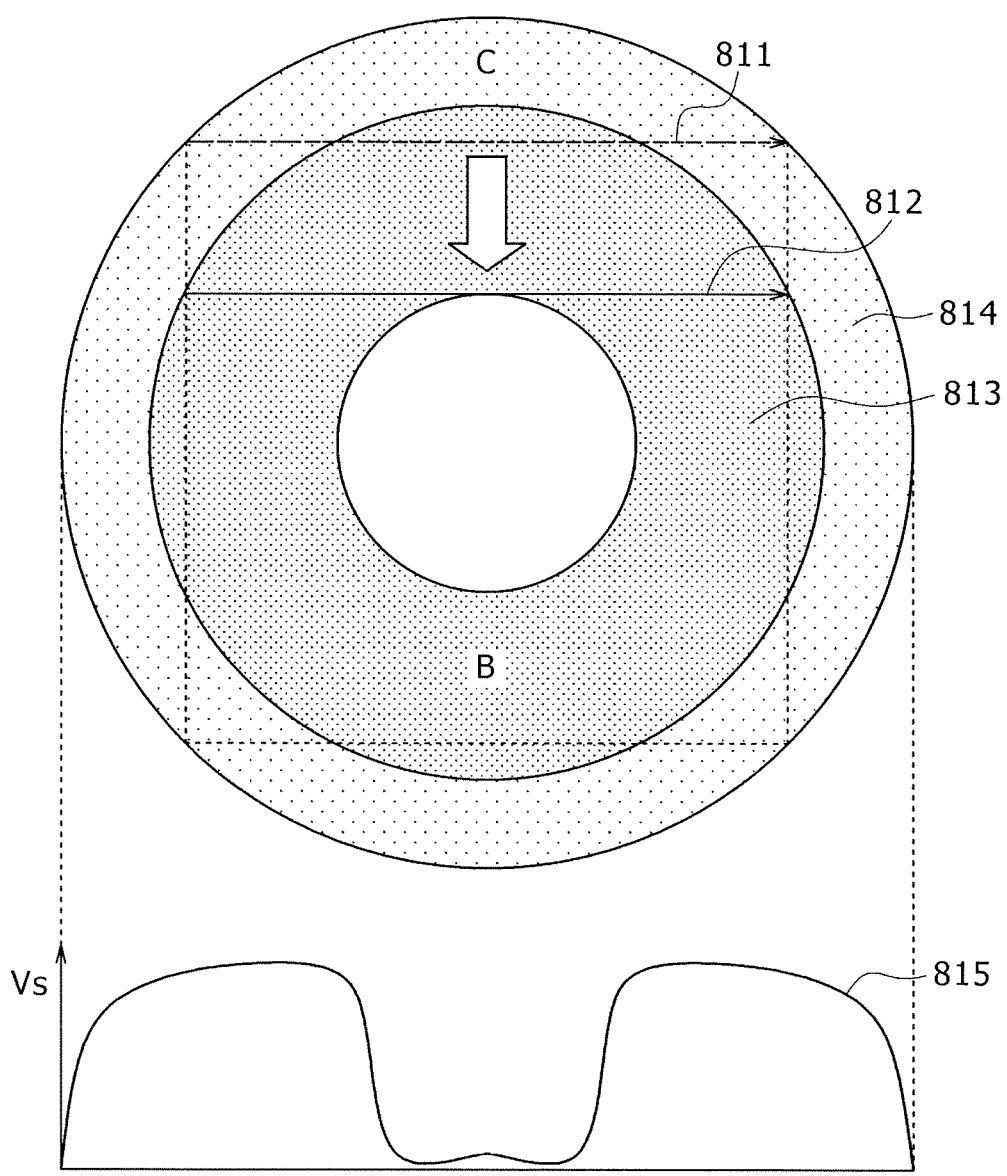
FIG. 8B is a diagram illustrating the precharge method according to the fourth embodiment and advantages provided by that precharge method.

Next, a second-stage precharge is performed. As shown in FIG. 8B, an electron beam scan is moved from a position 811 at which the electron beam scan is fixed in an initial step to a position 812 shifted in Y-direction toward the image center. When a raster rotation is conducted in the resulting state in the same manner as in the initial step, a precharge is performed anew with respect to ring-shaped region B 813. While the precharge is being performed with respect to ring-shaped region B 813, a positive charge remains in region C 814. Region C 814 is included in ring-shaped region A 807, which is positively charged in the initial step, and does not overlap with ring-shaped region B 813. Therefore, after the precharge is performed with respect to ring-shaped region B 813, the positive charge Vs is formed in a region containing region B 813 and region C 814 as indicated by a schematic diagram 815 in the lower half of FIG. 8B.

Figure 8C:
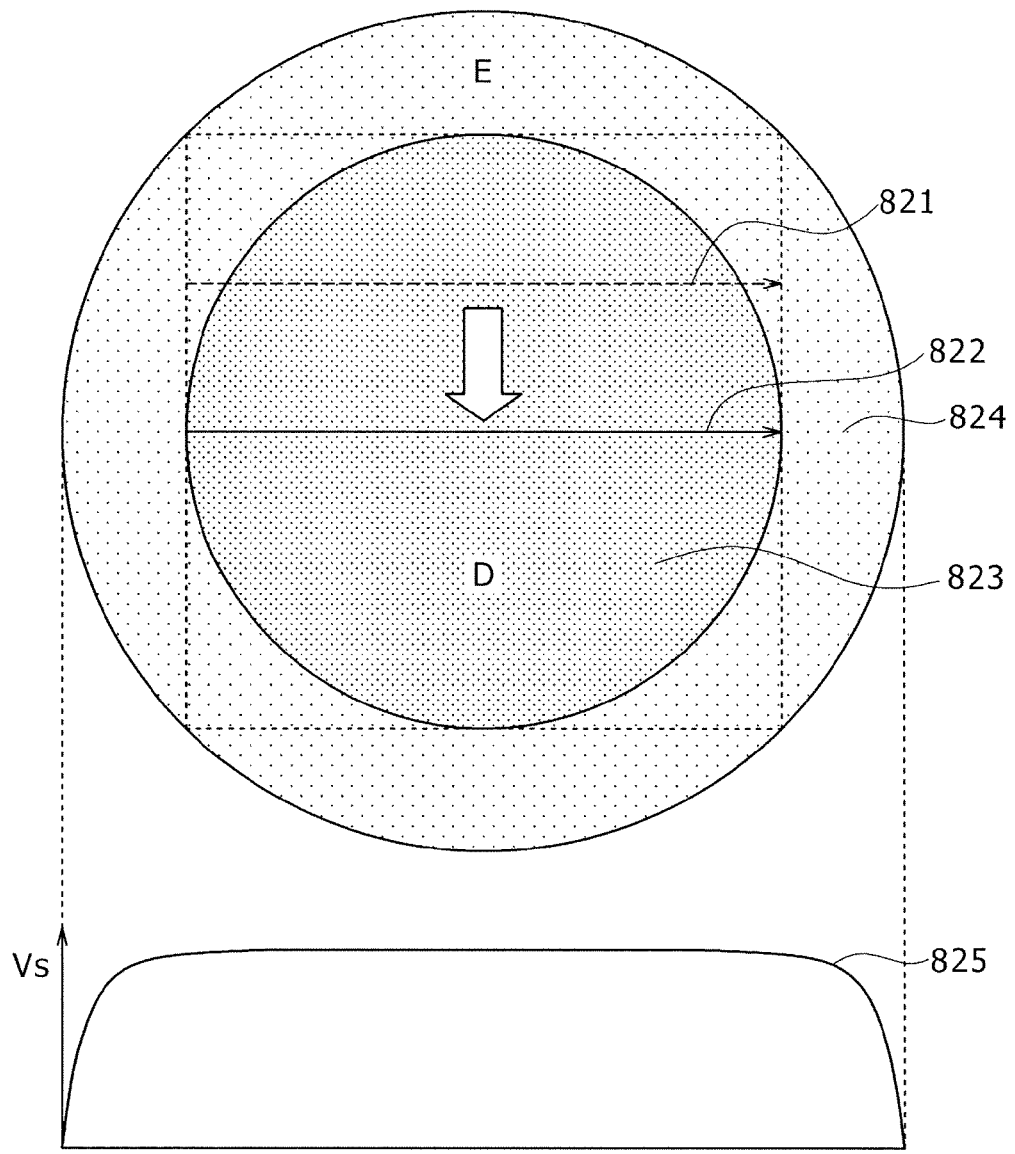
FIG. 8C is a diagram illustrating the precharge method according to the fourth embodiment and advantages provided by that precharge method.

As described above, the precharge is performed in a stepwise fashion by sequentially making a shift in Y-direction. Eventually, the electron beam scan reaches a position 822 that passes through the image center as shown in FIG. 8C. When the raster rotation is conducted in the resulting state, a precharge is performed with respect to region D 823. Consequently, as indicated by a schematic diagram 825 in the lower half of FIG. 8C, the positive charge Vs is formed in a region containing region E 824, which has been precharged, namely, in the entire region that is obtained by rotating 360 degrees the irradiation region 801 precharged by the conventional technology.

The electron beam scanning method described in conjunction with the present embodiment makes it possible to perform a process after radially dividing the precharge region into a plurality of concentric ring-shaped portions. Therefore, the profile of a positive charge can be controlled by varying the processing time for each step. Hence, a uniform positive charge can be formed in the entire precharge region. This makes it possible to avoid the problem of deflection that is caused by a horizontally-oriented electric field in a region other than the center of the positively-charged region. Further, as a secondary effect, it can be expected that the area of a charged region will become larger than when the conventional technology is used, thereby raising a saddle-point potential. Moreover, as the precharge is performed from an outer portion to an inner portion, the saddle-point potential generated during the precharge is higher than when the precharge is performed in an opposite direction. This makes it possible to raise the potential reached by the positive charge.

In addition, the processing time for each step may be made adjustable. An outer portion of the precharge region is positively charged intentionally to a voltage higher than the voltage of a central portion by setting a longer processing time for an outer ring-shaped region than for an inner ring-shaped region. This ensures that a large number of secondary electrons returning to the sample are attracted to the outside of an observation region when the center of the precharge region is observed at high magnification. Consequently, the observation region remains charged for a long period of time. This effect is particularly valid for a pattern length measurement apparatus (CD-SEM) that is often operated so as to align the center of the precharge region with the center of the observation region. The processing time for each step may be user-definable through a GUI displayed on a display screen or automatically defined by the apparatus.

As it is expected that the above-mentioned plurality of effects will be produced, the present embodiment has been described on the assumption that the electron beam scanning region is shifted from the outside to the inside. However, the present invention is not limited to such a method of shifting the electron beam scanning region. Alternatively, the electron beam scanning region may be shifted from the inside to the outside. Further, although the present embodiment has been described on the assumption that the processing time for each step is variable, a fixed amount of processing time may alternatively be allocated to all steps.

Furthermore, although the present embodiment has been described on the assumption that the precharge region is divided into the ring-shaped regions. However, the ring-shaped regions need not always be defined. Any scanning method may be used as far as the point to be precharged is irradiated with an electron beam in a plurality of different directions. For example, an alternative is to fix a scanning point for each of X- and Y-directions and perform a continuous spiral scan by conducting a raster rotation.

Moreover, no matter what scanning method is used, the electron beam tilt technology should be used to exercise control so that the electron beam is incident in a plurality of different directions for the purpose of forming a uniform charge on the inner wall of the contact hole. More specifically, when the method depicted in FIGS. 8A to 8C is used, an arbitrary point of the precharge region is scanned in two different directions by the electron beam. However, these two directions are determined in accordance with the positional relationship between the arbitrary point and the circle having the radius r2. It means that the electron beam is not always incident on the arbitrary point in all directions (360 degrees). In some cases, therefore, it may be difficult to charge the contact hole uniformly in all directions as described with reference to FIG. 4. As such being the case, when the arbitrary point is scanned a number of times by using the above-described scanning method while controlling the electron beam tilt angle and azimuth angle, it is possible to uniformly charge not only the contact hole but also the entire precharge region. In this instance, the electron beam may be controlled during the scanning in the above-mentioned two different directions so that the angle of incidence during a scan in one direction differs from the angle of incidence during a scan in the other direction. An alternative is to select a rotation angle of at least 360 degrees for the raster rotation with respect to a ring-shaped region such as region A 807 in FIG. 8A, charge the ring-shaped region throughout a plurality of revolutions, and change the angle of incidence after each revolution or after each scan relative to the arbitrary point.

Fifth Embodiment

Figure 9A:
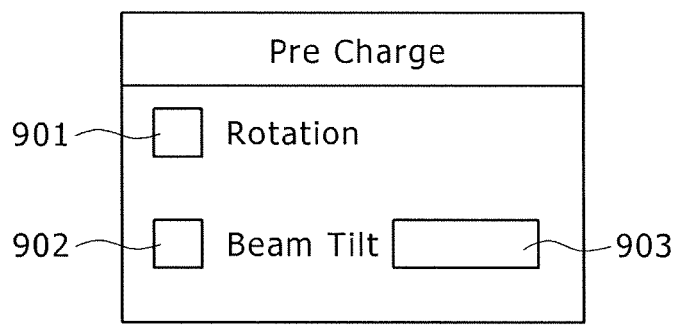
FIG. 9A is a diagram illustrating an example of a display screen of an apparatus to which the present invention is applied.
Figure 9B:
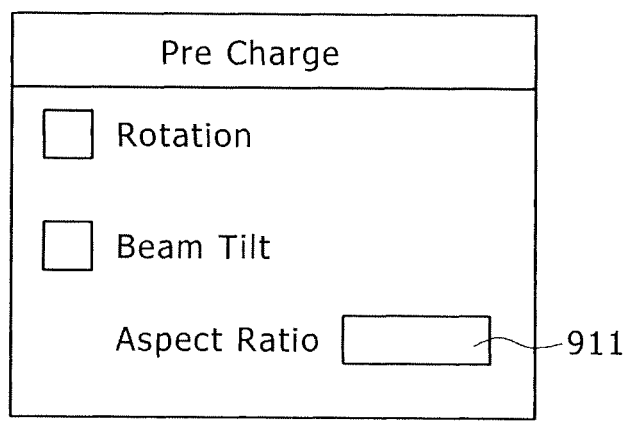
FIG. 9B is a diagram illustrating an example of the display screen of the apparatus to which the present invention is applied.

A fifth embodiment of the present invention will now be described with reference to FIG. 9. FIGS. 9A and 9B show examples of a software screen that controls the precharge process and appears on the display section 115 of the scanning electron microscope, based on the first to fourth embodiments, shown in FIG. 1. This screen is hereinafter referred to as the precharge window. The precharge window shown in FIG. 9A is provided with a Rotation check button 901, a Beam Tilt check button 902, and a tilt angle input section 903. When the Rotation check button 901 and the Beam Tilt check button 902 are selected, a precharge can be performed with the associated functions enabled as described below.

Selecting the Rotation check button 901 enables a function of conducting the raster rotation during a precharge. When a precharge is performed with such a function enabled, at least a process described in conjunction with the first or fourth embodiment is performed. An alternative is to let the user choose between the raster rotation described in conjunction with the first embodiment or a ring-shaped precharge described in conjunction with the fourth embodiment.

Selecting the Beam Tilt check button 902 performs a process of tilting the electron beam during a precharge as described in conjunction with the second embodiment. In this instance, the control section 114 controls various sections of the apparatus so that the tilt angle coincides with an angle entered in the tilt angle input section 903. As the effect intended by the second embodiment will not be produced simply by tilting the electron beam, a function of changing the azimuth angle during a precharge is also enabled when the Beam Tilt check button 902 is selected. Although the timing for changing the azimuth angle may be predefined, the azimuth angle to be selected should be at least 180 degrees symmetrical with respect to the formerly selected one.

An exemplary method of determining the electron beam tilt angle in accordance with the aspect ratio information about the sample will now be described with reference to FIG. 9B. The precharge window shown in FIG. 9B is provided with an Aspect Ratio input section 911, which is subordinate to the Beam Tilt check button 902. The Aspect Ratio input section 911 accepts the input of an aspect ratio of the contact hole formed in the sample 110. A trajectory that geometrically permits the electron beam to become incident on the center of the bottom of the contact hole is then determined from the input aspect ratio. The electron beam tilt angle is calculated from the following equation.

$$\text{Tilt angle } \theta = \tan^{-1}\left(\frac{1}{2 \times \text{aspect ratio}}\right) \pm a \quad \text{Equation (3)}$$

The value "a" in Equation (3) is a correction value for the tilt angle. As described in conjunction with the third embodiment, a beam alignment electron beam tilt more or less occurs in a scanning electron microscope. In addition, the sample itself is not completely flat and may be tilted to a certain extent. Therefore, if the tilt angle is determined in accordance with a geometrically calculated value, the electron beam may become incident only on an outer portion of the bottom of the contact hole. Consequently, when the precharge method according to the fifth embodiment is used, correction value a should be added to the calculated value to provide the electron beam tilt angle with a predetermined margin. Conditions under which correction value a is determined should be adjusted in consideration of the material and structure of the sample and possible changes in the electron beam trajectory due to electrooptical conditions. Further, when the correction value is adjusted as needed in accordance with the angle of raster rotation, a precharge can be performed at an optimum tilt angle while offsetting the tilt of the sample itself.

An exemplary display section of the scanning electron microscope according to the fifth embodiment and an exemplary method for controlling an electron beam tilt angle have been described above. However, the fifth embodiment is not limited to the above-described display section and method for controlling an electron beam tilt angle. For example, an alternative is to display a selected check button in reverse video to facilitate the identification of the selected check button or display a pull-down menu instead of the check buttons. Also in the method for determining an electron beam tilt angle, although the fifth embodiment uses the aspect ratio as an input parameter, an alternative is to use film thickness as an input parameter. When this alternative method is used, the aspect ratio can be determined by measuring the opening diameter of the contact hole and dividing the measured opening diameter by the film thickness. When this alternative method is adopted during the use of a CD-SEM, which obviously has an automatic length measurement function because it is designed for pattern length measurement, the electron beam tilt angle can be automatically determined without adding a new function to the apparatus.

Moreover, as the opening diameter may vary with process conditions, the above alternative method is at an advantage in that an optimum angle can be determined in accordance with the point of observation. In addition, a preset function for storing conditions concerning one or more of the above methods in a memory beforehand and performing setup with ease by reading such stored conditions may be incorporated.

| Description of Reference Numerals | |
| --- | --- |
| 101 | Electron source |
| 102 | Extraction electrode |
| 103 | Anode |
| 104, 203, 501, 601 | Electron beam |
| 105 | Condenser lens |
| 106 | Aperture |
| 107 | Deflector |
| 108, 503 | Objective lens |
| 109 | Booster electrode |
| 110, 504 | Sample |
| 111, 721 | Secondary electrons |
| 112 | Detector |
| 113 | Retarding power supply |
| 114 | Control section |
| 115 | Display section |
| 116 | Storage means |
| 117 | Image processing section |
| 201, 401, 701 | Silicon wafer |
| 202, 402, 704 | Insulating film |
| 204, 405, 711, 722 | Positive charge |
| 301 | Electron beam scanning region A |
| 302, 603 | Electron beam scanning direction a |
| 303 | Electron beam scanning region B |
| 304 | Electron beam scanning direction b |
| 305 | Angle θ |
| 311 | Contact hole nondefective portion |
| 312 | Contact hole defective portion |
| 403 | Initial electron beam irradiation direction |
| 404 | Next-step electron beam irradiation direction |
| 502 | Aligner |
| 505 | Optical axis |
| 602 | Precharge region A |
| 604 | Electron beam tilt angle |
| 605, 611 | Azimuth angle |
| 702 | Insulating layer |
| 703 | Silicon layer |
| 712 | Low elevation angle secondary electrons |
| 713 | High elevation angle secondary electrons |
| 801 | Irradiation region precharged by conventional technology |
| 802 | Uppermost line |
| 803, 804 | Circle |
| 805 | Radius r1 |
| 806 | Radius r2 |
| 807 | Region A |

-continued

| Description of Reference Numerals | |
| --- | --- |
| 808, 815, 825 | Schematic diagram |
| 811 | Position at which an electron beam scan is fixed in an initial step |
| 812 | Position at which the electron beam scan is fixed in the next step |
| 813 | Region B |
| 814 | Region C |
| 821 | Position at which the electron beam scan is fixed in the next step |
| 822 | Position at which the electron beam scan is fixed in a final step |
| 823 | Region D |
| 824 | Region E |
| 901 | Rotation check button |
| 902 | Beam Tilt check button |
| 911 | Aspect Ratio input section |

The invention claimed is:

1. A scanning electron microscope that scans a sample with a primary electron beam to precharge a region on the sample and detects secondary electrons or backscattered electrons obtained by scanning the precharged region on the sample with the primary electron beam, the scanning electron microscope comprising:

an electrooptical system that scans the sample with the primary electron beam and outputs a signal in accordance with the detected secondary electrons or backscattered electrons; and a control section that controls the electrooptical system; wherein the control section controls the electrooptical system so as to scan a precharge region during a precharge in a plurality of directions.

2. The scanning electron microscope according to claim 1, wherein the control section controls the electrooptical system so as to scan the precharge region with the primary electron beam in a plurality of directions that provide different angles of incidence.

3. The scanning electron microscope according to claim 1, wherein the control section two-dimensionally scans an X-Y plane with the primary electron beam and rotates the two-dimensionally scanned region in a plane around the center-of the precharge region.

4. The scanning electron microscope according to claim 1, wherein the direction of the primary electron beam scan performed during the precharge varies at predetermined time intervals.

5. The scanning electron microscope according to claim 1, further comprising:

a display screen that displays a GUI for defining the angle of incidence of the primary electron beam with respect to the sample or the aspect ratio of the sample.

6. A scanning electron microscope that scans a predetermined region on a sample with a primary electron beam to precharge the region and scans a region contained in the precharged region with the primary electron beam to acquire an image of the scanned region, the scanning electron microscope comprising:

an electrooptical system that scans the sample with the primary electron beam; and a control section that controls the electrooptical system; wherein the precharge is performed by defining a ring-shaped scanning region containing the predetermined region with respect to the predetermined region and irradiating the scanning region with the primary electron beam while reshaping the scanning region.

7. The scanning electron microscope according to claim 6, further comprising:
a display screen that displays a GUI capable of defining a period of time of charging the ring-shaped scanning region for each outside diameter of the ring-shaped scanning region.

8. The scanning electron microscope according to claim 6, further comprising:
a GUI that defines precharge process conditions;
wherein the GUI includes mode selection means for performing a precharge by using the ring-shaped scanning region.

9. The scanning electron microscope according to claim 6, wherein the control section controls the electrooptical system so as to perform a spiral scan with respect to the defined ring-shaped scanning region.

10. A scanning electron microscope that scans a sample with an electron beam to precharge a region on the sample and acquires an image by scanning a region contained in the precharged region with the electron beam, the scanning electron microscope comprising:
an electrooptical system that scans the sample with the electron beam; and
a control section that controls the electrooptical system;
wherein the control section exercises control so as to perform a scan by rotating a scanning line of the electron beam while the midpoint of the scanning line is in contact with a predetermined circumference.

11. A sample observation method comprising the steps of:
defining a region containing an observation region as a precharge irradiation region;
performing a first precharge by scanning a first ring-shaped region in a plurality of scanning directions, the first ring-shaped region being concentric with the observation region;
performing a second precharge by scanning a second ring-shaped region in a plurality of scanning directions, the second ring-shaped region being concentric with the first ring-shaped region and different from the first ring-shaped region in outside diameter; and
observing the observation region, which is completely precharged by repeatedly performing the first precharge and the second precharge.

* * * * *

UNITED STATES PATENT AND TRADEMARK OFFICE
CERTIFICATE OF CORRECTION

PATENT NO. : 8,519,334 B2
APPLICATION NO. : 13/639999
DATED : August 27, 2013
INVENTOR(S) : Satoshi Takada et al.

It is certified that error appears in the above-identified patent and that said Letters Patent is hereby corrected as shown below:

On the Title Page
Item (75) Inventors:
Please Change "Satoshi Tadaka, Hitchcinaka (JP)" to Satoshi Takada Signed and Sealed this
Twelfth Day of November, 2013

Teresa Stanek Rea
*Deputy Director of the United States Patent and Trademark Office*